United States Patent
Amoroso et al.

(10) Patent No.: US 12,300,493 B2
(45) Date of Patent: May 13, 2025

(54) ISOLATING ION IMPLANTATION OF SILICON CHANNELS FOR INTEGRATED CIRCUIT LAYOUT

(71) Applicant: Synopsys, Inc., Mountain View, CA (US)

(72) Inventors: Salvatore Maria Amoroso, Hamilton (GB); Plamen Asenov, Glasgow (GB); Victor Moroz, Saratoga, CA (US)

(73) Assignee: Synopsys, Inc., Sunnyvale, CA (US)

( * ) Notice: Subject to any disclaimer, the term of this patent is extended or adjusted under 35 U.S.C. 154(b) by 607 days.

(21) Appl. No.: 17/689,859

(22) Filed: Mar. 8, 2022

(65) Prior Publication Data

US 2022/0302284 A1     Sep. 22, 2022

Related U.S. Application Data

(60) Provisional application No. 63/162,397, filed on Mar. 17, 2021.

(51) Int. Cl.

| | |
|---|---|
| *H01L 21/225* | (2006.01) |
| *H01L 21/027* | (2006.01) |
| *H01L 21/265* | (2006.01) |
| *H01L 21/266* | (2006.01) |
| *H10D 30/01* | (2025.01) |

(Continued)

(52) U.S. Cl.
CPC ...... *H01L 21/2253* (2013.01); *H01L 21/0274* (2013.01); *H01L 21/265* (2013.01); *H01L 21/26513* (2013.01); *H01L 21/266* (2013.01); *H10D 30/0241* (2025.01);
(Continued)

(58) Field of Classification Search
CPC ... H01L 21/027; H01L 21/0274; H01L 21/22; H01L 21/2253; H01L 21/265; H01L 21/26506; H01L 21/26513; H01L 21/26586; H01L 21/266; H01L 21/762; H01L 21/823412; H01L 21/823418; H01L 21/823431; H01L 21/823481; H01L 29/66795; H01L 29/66803; H10D 30/019; H10D 30/0191–0194; H10D 30/0241
See application file for complete search history.

(56) References Cited

U.S. PATENT DOCUMENTS

| | | |
|---|---|---|
| 7,681,164 B2 | 3/2010 | Lin et al. |
| 2006/0019174 A1* | 1/2006 | Ahn ............... G03F 7/70625 204/192.12 |

(Continued)

OTHER PUBLICATIONS

Gupta, S. et al. "7-nm FinFET CMOS Design Enabled by Stress Engineering Using Si, Ge, and Sn." IEEE Transactions on Electron Devices, vol. 61, No. 5, May 2014, pp. 1222-1230.

*Primary Examiner* — Cheung Lee
(74) *Attorney, Agent, or Firm* — Fenwick & West LLP

(57) ABSTRACT

A configuration to isolate ion implantation of silicon channels for placement of integrated circuit devices within an integrated circuit layout. The configuration layers a photolithographic mask having one or more openings on a silicon substrate. The configuration directs a focused ion beam towards the silicon substrate to implant ions in the silicon substrate at the one or more openings in the photolithographic mask. The configuration anneals the silicon substrate with the layered photolithographic mask to activate a reaction between silicon of the silicon substrate and the implanted ion to achieve an ionized formation in the silicon substrate.

20 Claims, 8 Drawing Sheets

Low-Energy tilted implants at two rotational angles

(51) Int. Cl.
*H10D 84/01* (2025.01)
*H10D 84/03* (2025.01)

(52) U.S. Cl.
CPC ..... *H10D 84/0151* (2025.01); *H10D 84/0158* (2025.01); *H10D 84/038* (2025.01); *H10D 84/0128* (2025.01)

(56) References Cited

U.S. PATENT DOCUMENTS

2009/0315115 A1* 12/2009 Zhang ............... H01L 21/76224
　　　　　　　　　　　　　　　　　　　　　　　257/E27.06
2015/0118822 A1* 4/2015 Zhang ............... H01L 29/66795
　　　　　　　　　　　　　　　　　　　　　　　438/433

* cited by examiner

Contamination of neighbors source/drain regions by means of scattering and diffusion of implanted oxygen ions.

Low-Energy tilted implants at two rotational angles

*Simplified steps for the processing of a FinFET transistor:*
*(a) Fin patterning. (b) STI formation. (c) Polygate definition.*
*(d) Spacer formation and S/D recess. (e) In situ doped S/D epitaxial regrowth.*
*(f) Poly removal and gate-last high-k metal gate (replacement metal gate).*

ISOLATING ION IMPLANTATION OF SILICON CHANNELS FOR INTEGRATED CIRCUIT LAYOUT

CROSS REFERENCE TO RELATED APPLICATIONS

This application claims the benefit of priority to U.S. Provisional Application No. 63/162,397, filed on Mar. 17, 2021, which is incorporated herein in its entirety for all purposes.

TECHNICAL FIELD

The present disclosure relates to isolation of adjacent transistors in an integrated circuit layout.

BACKGROUND

In semiconductor processing, Shallow Trench Isolations (STI) isolate adjacent transistors in an integrated circuit layout. Conventional means allow for electrical separation between adjacent transistors through etching a silicon channel and depositing silicon dioxide to form an STI. While conventional processes may provide for electrical separation, such processes introduce lithography and stress proximity effects that are particularly deleterious for scaled standard cells and, especially, for the silicon-germanium (SiGe) technology.

SUMMARY

Disclosed is a process for placing integrated circuit devices within an integrated circuit layout by replacing the use of active isolation gates with passive dielectric separations obtained. In one example embodiment this may be done by an in-situ oxidation of silicon achieved with oxygen ion implantation. This process allows not only to avoid the negative effects associated with the presence of isolation gates, but also avoids the use of etching techniques to obtain the dielectric isolation and, in turn, enable the preservation of the engineered mechanical stress that is especially beneficial for SiGe-based technology.

By way of example, a process for ion implantation or plasma doping may isolate devices within an integrated circuit layout. The process layers a photolithographic mask having one or more openings on a silicon substrate and directs a focused ion beam towards the silicon substrate to implant ions in the silicon substrate. The process anneals the silicon substrate to activate a reaction between silicon of the silicon substrate and the implanted ion to achieve formation of a dielectric material in the silicon substrate.

In one example embodiment, the focused ion beam may be an oxygen ion beam and the formed dielectric material in a silicon substrate is a silicon dioxide. In another example embodiment, the focused ion beam may be a nitrogen ion beam and the formed dielectric material in a silicon substrate is a silicon nitride.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
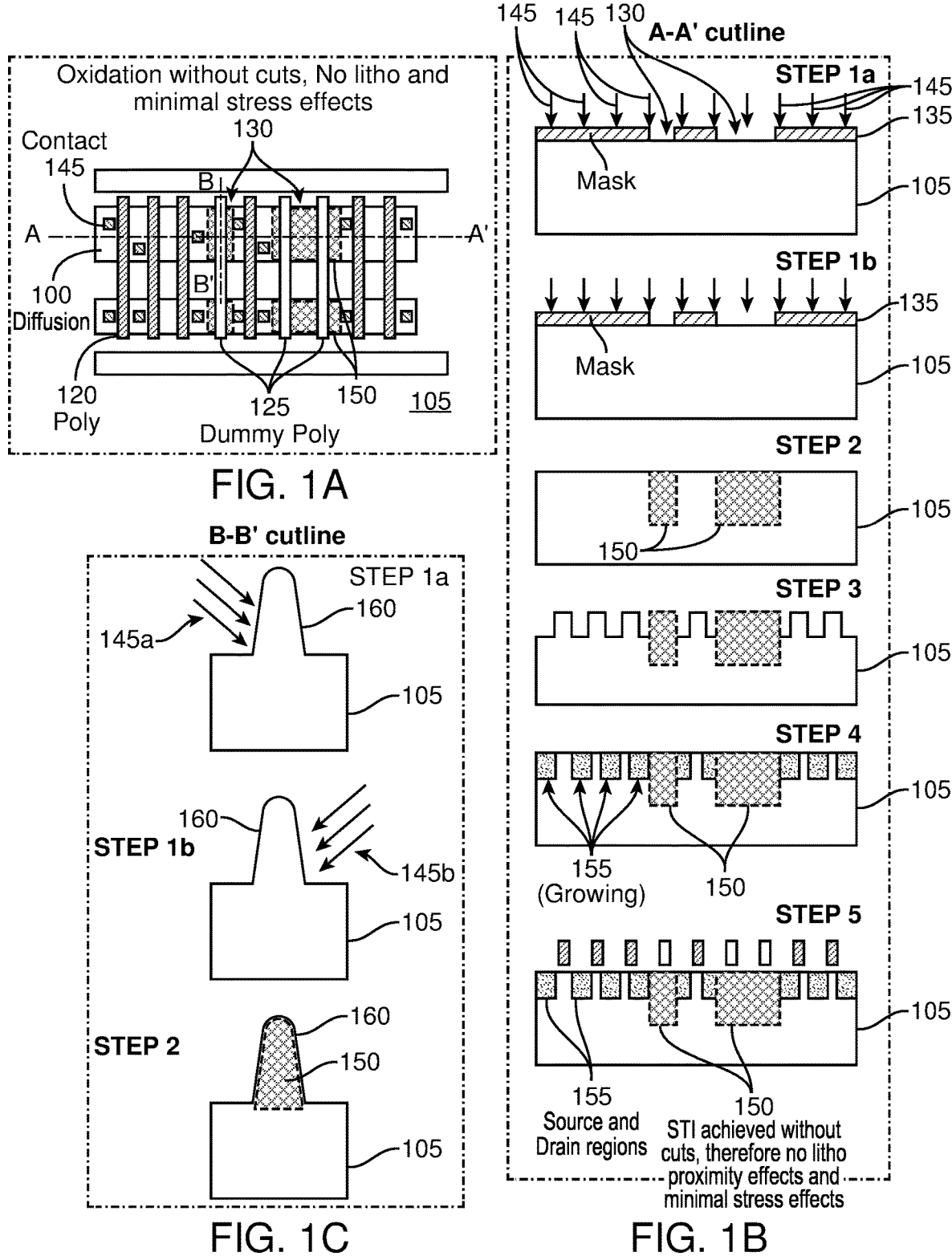
FIGS. 1A-1C illustrate an example embodiment of a STI formation by means of direct oxidation of the silicon material.

Disclosed is a process and system for optimizing placement of integrated circuit devices within an integrated circuit layout by means of ion implanted shallow trench isolations. The disclosed configuration achieves superior electrical isolation between transistors obtained by conventional Shallow Trench Isolations (STI) approach, while minimizing the negative lithography and stress proximity effects associated with the STI formation.

Isolation of adjacent transistors in an integrated circuit layout is achieved by means of STI. Transistors placed within a layout of a typical standard cell use electrical separation between continuously adjacent transistors of the same type (n-type metal oxide semiconductor (nMOS) or p-type metal oxide semiconductor (pMOS)). The separation is obtained via etching of a silicon channel and by depositing silicon dioxide to form an STI. This kind of electrical separation allows for electrical performance as the transistors are separate by dielectric material, but introduces lithography and stress proximity effects that are particularly deleterious for scaled standard cells. The latter has been adopted as booster for the pMOS performance and it relies on the compressive stress induced by the SiGe source/drain regions longitudinally to the silicon channel direction.

When STI is formed, the longitudinal SiGe stress is lost by lattice relaxation during the trench etching and some amount of uncontrolled stress is afterwards introduced during the trench filling with silicon dioxide. This may be a double loss for PMOS performance because the engineered stress is lost, and some uncontrolled stress-induced proximity effect may be introduced.

Continuously adjacent transistors in advanced layouts are separated by means of isolation gates. When applied to SiGe-based fin field effect transistor (FinFET) technologies, it preserves engineered mechanical stress otherwise lost during the etch-filling of STI formation. Contrary to the passive isolation offered by STI, the isolation gate represents an active method to electrically separate continuously adjacent transistors. In this case, rather than etching away the channel of the transistor that has to be cut off and introducing a dielectric material, the channel is left intact. It is, however, electrically turned off by exploiting the normal functioning of a metal oxide semiconductor field effect transistor (MOSFET) device.

Adoption of isolation gates minimizes lithography and stress proximity effects. The isolation of gates, however, may cause the current leakage between transistors to be higher than conventional STI separation, therefore posing limitations in terms of static power. In addition, the dynamic power may worsen due to the additional gates adding parasitic capacitive load. Further, gate oxide reliability for the isolation transistors may cause charge trapping build-up and time-dependent dielectric breakdown because isolation gates are constantly biased to keep the MOSFET in off state. There also may be pressure on the gate cut process to ensure neighboring dummy gates do not lead to a short between Vdd and Vss. The disclosed configuration as further described herein addresses, and beneficially overcomes, these aspects.

Referring now to figures (FIGS. 1A-1C, illustrated is an example embodiment of a STI formation through direct oxidation of the silicon material. In particular, the principles described herein may apply for ion implantation or plasma doping to isolate devices in a silicon substrate. FIGS. 1A through 1C illustrate application of a beam of oxygen ions with given energy, angle and dose for implantation in the silicon material, followed by an annealing step to activate the reaction between silicon and oxygen and to form a dielectric material in the silicon substrate.

FIG. 1A illustrates a final result from application of the disclosed configuration. A layout is obtained with transistors isolated by means of passive dielectrics instead of active isolation gates. The dielectrics are obtained without silicon cuts and with the process disclosed eliminates lithography proximity effects and minimize stress proximity effects.

The device in FIG. 1A includes a silicon substrate 105. The silicon substrate may be a silicon-germanium substrate (SiGe). The silicon substrate 105 shown indicates a diffusion layer 110, contract points 105, poly layers 120, dummy poly layers 125, and cut regions 130. Also shown are "cut lines" A-A' and B-B', which are a result of the processes described with FIGS. 1B and 1C.

FIG. 1B illustrates an example processing "reel" (steps applied to a silicon substrate die) as viewed from the A-A' cut line. In FIG. 1B at steps 1a and 1b, the silicon substrate 105 has a photolithographic mask 135. Ions 145 are applied so that they may be implanted directly into a narrow opening of the photolithographic mask 135. During the implant some of the ions 145 may scatter in lateral directions, which may create gaussian-like profiles in lateral directions in addition to gaussian-like profiles in the vertical direction. Typically, it can be expected that, if the implant energy is chosen such that the peak of oxygen distribution is ~30 nm deep, then both the vertical and the lateral spread will be ~10 nm. To achieve full STI formation, e.g., to fill the desired fin with oxygen, several different implant energies (e.g., one implant at 5 keV followed by another at 15 keV) may be applied. This may create lateral spread and potentially contaminate adjacent transistors with ions, particularly the source/drain regions of the adjacent transistors that are located next to the oxidized fin and whose size is comparable with the oxygen lateral spread. To overcome a neighbor contamination issue, example embodiments to address include what is shown in FIG. 1B and FIG. 1C.

Referring in more detail to FIG. 1B, illustrated is a simplified schematic of processing steps for a finFET transistor from the A-A' cutline of FIG. 1A. Step 1a and Step 1b show a photolithographic mask (or mask) 135 placed on the silicon substrate 105. The mask 135 includes one or more openings 130 exposing the silicon substrate 105 where the transistors are to be placed. Once the mask 135 is in place, an ion beam 145 (illustrated with arrows) is directed towards the silicon substrate 105 with the mask 135 overlay. The ion beam 145 may be an oxygen (O+) or nitrogen (N+) ion beam. The openings of the mask 135 that are exposed are bombarded with the ion beam 145.

Figure 2:
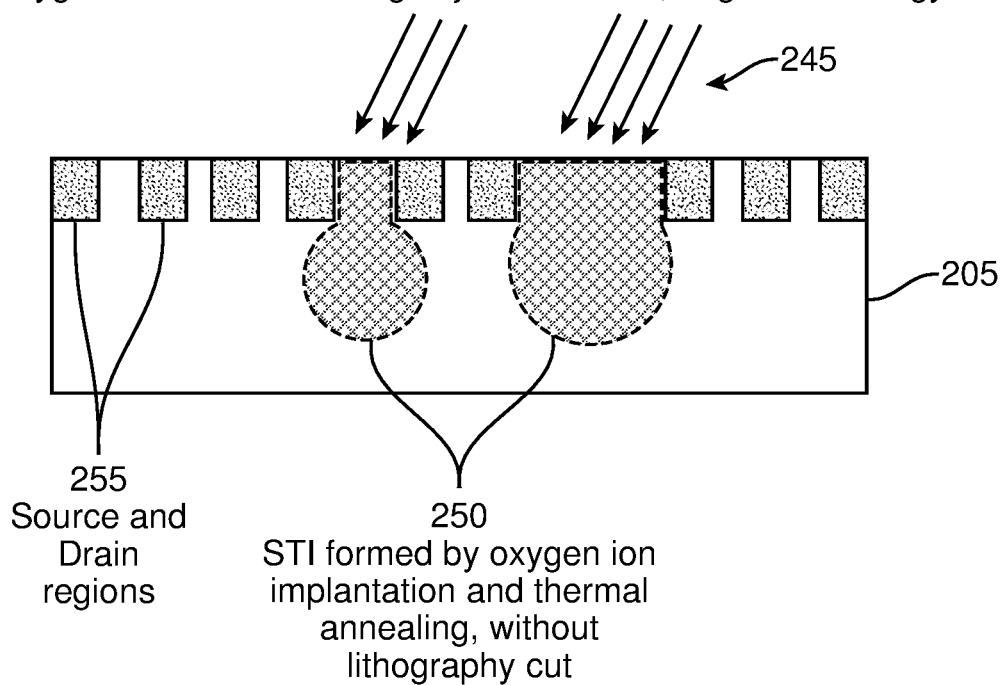
FIG. 2 illustrates another example of oxygen ion implantation and thermal annealing process to isolate continuously adjacent transistors in a layout of a silicon substrate.

In Step 2 of FIG. 1B, the mask 135 is removed through an annealing process (e.g., thermal annealing). The annealing process causes an oxidation reaction with the silicon substrate to form a dielectric material 150. For example, if the ion beam 145 is an oxygen ion beam the dielectric materials is silicon dioxide ($SiO_2$) and if the ion beam 145 is a nitrogen ion beam, the dielectric material is silicon nitride. Using an oxygen ion beam as an example, after the implantation is successfully achieved without contamination of adjacent transistors, the oxygen-silicon bonding may be activated by means of a thermal annealing. Due to the volume expansion resulting during the silicon dioxide formation, it is expected that high compressive stress longitudinally with the channels direction will arise, introducing undesired stress-induced proximity effect into neighbor transistors. FIG. 2 illustrates an example oxygen ion implantation and thermal annealing method without a lithography cut to isolate continuously adjacent transistors in a layout of a silicon substrate 205. Specifically, as ion beams 245 bombard a substrate 205, a resulting dielectric 250 begins to form in the substrate 205.

Referring back to FIG. 1B, Step 3 illustrates early fin (of a finFET implantation) isolation in the silicon substrate 105. Here, adjacent transistors source/drain regions 155 (shown in step 4 and step 5) contaminated with the implantation can be removed when the next etching step is performed to remove the parts of the fin where the epitaxial silicon-germanium (SiGe) source/drain regions 155 are grown. The undesired implanted oxygen will be removed with that silicon (Si) etch.

Figure 3:
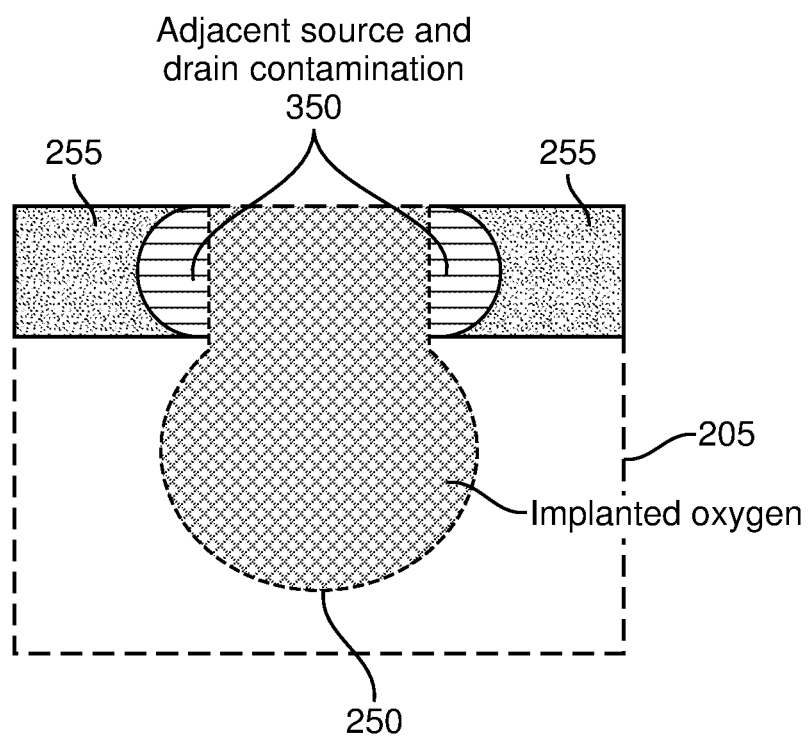
FIG. 3 illustrates an example of contamination of neighboring source/drain regions by means of scattering and diffusion of implanted oxygen ions within the silicon substrate.

Steps 4 and 5 of FIG. 1B illustrate formation of the source and drain regions 155 as well as achieving STI without cuts thereby reducing stress on the silicon. FIG. 3 illustrates an example of contamination of neighboring source/drain regions by means of scattering and diffusion of implanted oxygen ions within the silicon substrate. Specifically, once the ion beams 245 bombard the substrate 205, the resulting dielectric 250 forms, but also begins to bleed towards adjacent source and drain regions 350 of the substrate.

Referring back to FIG. 1C, it illustrates the technique of performing tilted implants on a fin 160 of a finFET at two different rotation angles of how the ion beams 145 are applied. By adopting this technique, a low energy ion beam (e.g., low energy oxygen ion beam) may be used because only half of the fin need to be penetrated at each implantation angle 145a, 145b (generally 145) (e.g., 2 nanometers (nm) to 3 nm). For example, in FIG. 1C, Step 1 a illustrates an ion beam 145a applied to one side of the fin 160 and Step 1b illustrates the ion beam 145b applied to the other side of the fin 160. The ion beam may be focused by positioning a source (e.g., accelerator) of the ion beam at the respective angles 145a, 145b and/or the ion beam maybe be focused by applying (or positioning) a mask to direct transmission of the ion beams 145a, 145b at the respective angles. At such a low energy, lateral scattering will be within 2 nm, so that the oxygen contamination of adjacent transistors is prevented or minimized Step 2 of FIG. 1C shows the oxidation of the silicon to form a silicon dioxide ($SiO_2$) 150 at the fin 160 when an oxygen ion beam is applied.

Figure 4A:
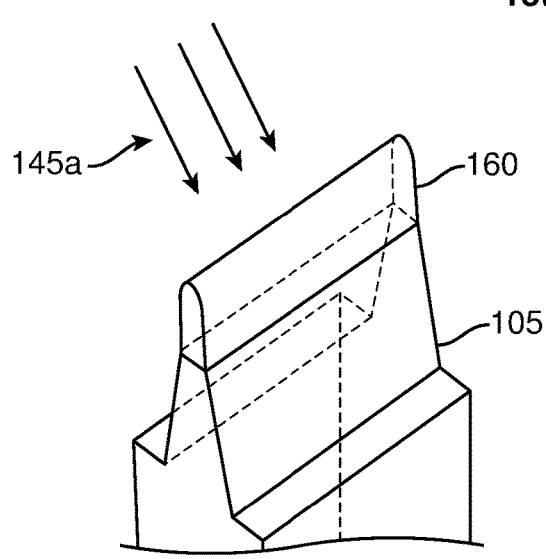
FIG. 4A and FIG. 4B illustrate a three-dimensional (3D) view of low energy tilted implant at two rotation angles applied to a fin of a finFET.
Figure 4B:
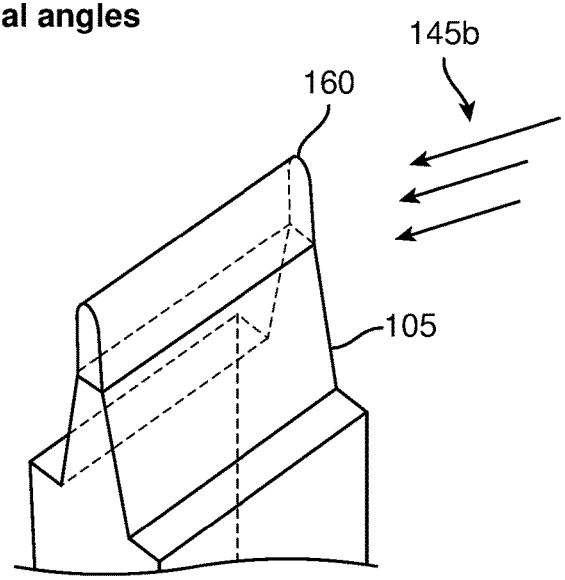

FIGS. 4A and 4B illustrate a three-dimensional (3D) view of low energy tilted implant at two rotation angles applied to the fin 160 of a finFET. For example, as described with FIG. 1C, an ion beam is applied at a first angle 145a to the fin 160 of the silicon substrate 105. Separately, an ion beam is applied at a second angel 145b to the fin 160 of the silicon substrate 105. The application of the ion beams at two separate angled allows for the isolated implantation of the ions in the fin 160 of the substrate 105.

Figure 5A:
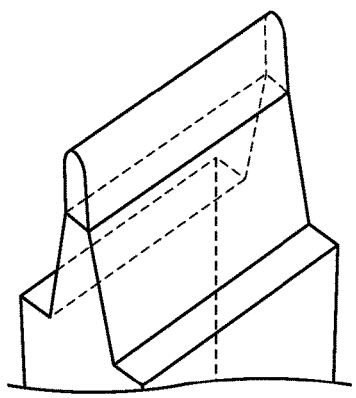
FIGS. 5A-5F illustrate example simplified steps for the processing of a FinFET transistor.
Figure 5B:
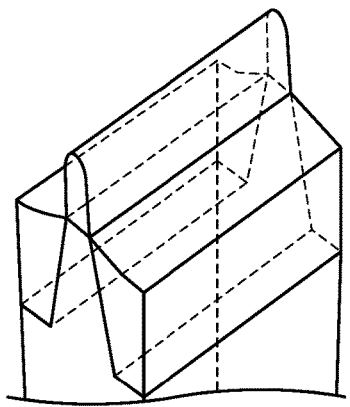
Figure 5C:
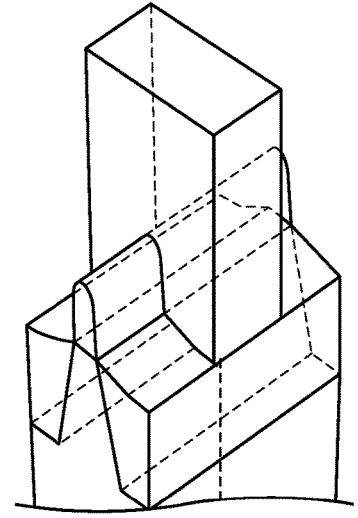
Figure 5D:
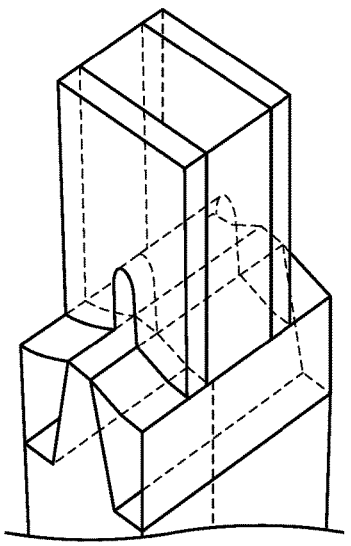
Figure 5E:
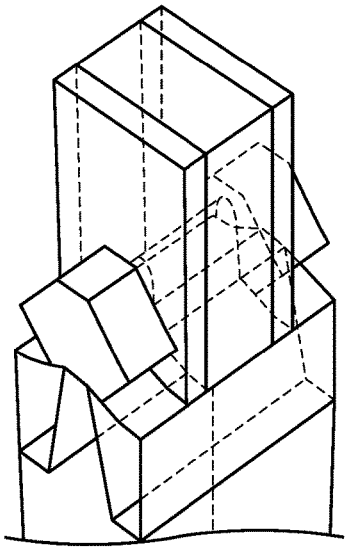
Figure 5F:
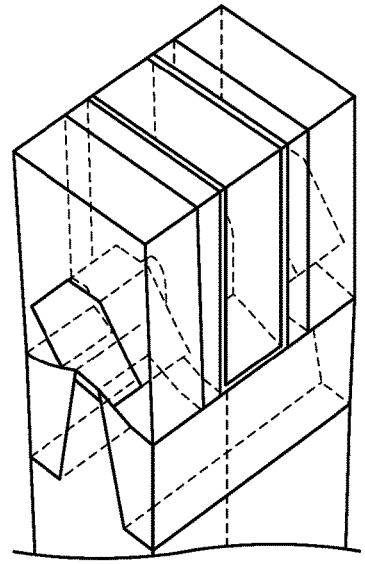

FIGS. 5A-5F illustrate steps for the processing of a FinFET transistor within a three-dimensional model. The disclosed configuration may be applied to such processing steps to apply isolation where desired, e.g., at a fin. The processing steps include in FIG. 5A a fin patterning, e.g., fin 160 followed by STI formation before formation of the transistors in FIG. 5B. FIG. 5C illustrates subsequent Poly-gate definition. FIG. 5D illustrates Spacer formation and S/D recess. FIG. 5E illustrates in situ doped S/D epitaxial regrowth and FIG. 5F illustrates poly removal and gate-last high-κ metal gate (replacement metal gate).

In the disclosed configuration, high stress can be avoided by letting the oxide to naturally expand in the direction perpendicular to the channel direction if there space as in the case, for example, of the thermal annealing being executed before the poly formation (see, e.g., FIG. 1B). Another option may be to follow the oxygen ion implant with a nitride ion implant as it known this can reduce the compressive stress because of the smaller difference of thermal expansion coefficients between silicon and silicon nitride formed in the oxidized channel.

Referring back to FIG. 1A, show is a final result from application of the disclosed configuration. A layout is obtained with transistors isolated by means of passive dielectrics instead of active isolation gates. The dielectrics are obtained without silicon cuts and with the methodology described in the disclosure to eliminate lithography proximity effects and minimize stress proximity effects.

Figure 6:
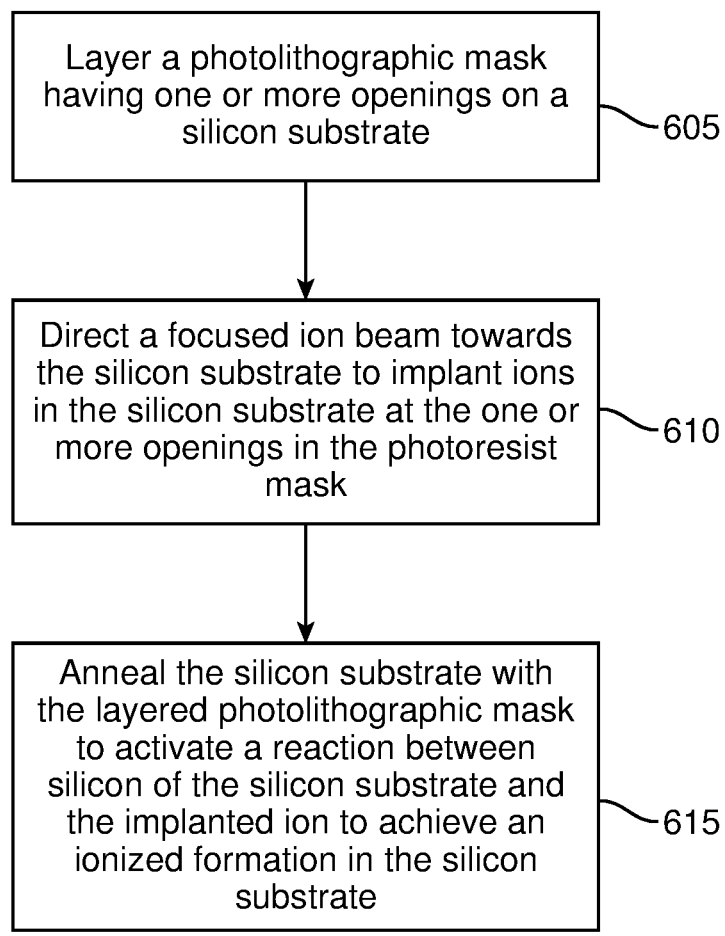
FIG. 6 illustrates an example process for ion implantation of silicon channels for placement of integrated circuit devices within an integrated circuit layout.

FIG. 6 illustrates an example process for ion implantation of silicon channels for placement of integrated circuit devices within an integrated circuit layout. The process layers 605a photolithographic (or other photoresist) mask having one or more openings on a silicon substrate. A focused ion beam is directed 610 towards the silicon substrate. The beam implants ions in the silicon substrate at the one or more openings in the photolithographic mask. The ion mean may be an oxygen (O+) or nitrogen (N+) ion beam to react with the silicon substrate. For example, an oxygen ion beam with cause the silicon substrate to oxidize where the beam is applied to the exposed silicon substrate. After the ion beam exposure, the process anneals 615 (e.g., thermal annealing) the silicon substrate to activate a reaction between silicon of the silicon substrate and the implanted ion to achieve an ionized formation in the silicon substrate. The process may continue with etching away the photolithographic mask.

The principles of the process described also may be applied through plasma doping, with the steps noted similarly applied.

Example Electronic Design Automation Process

Figure 7:
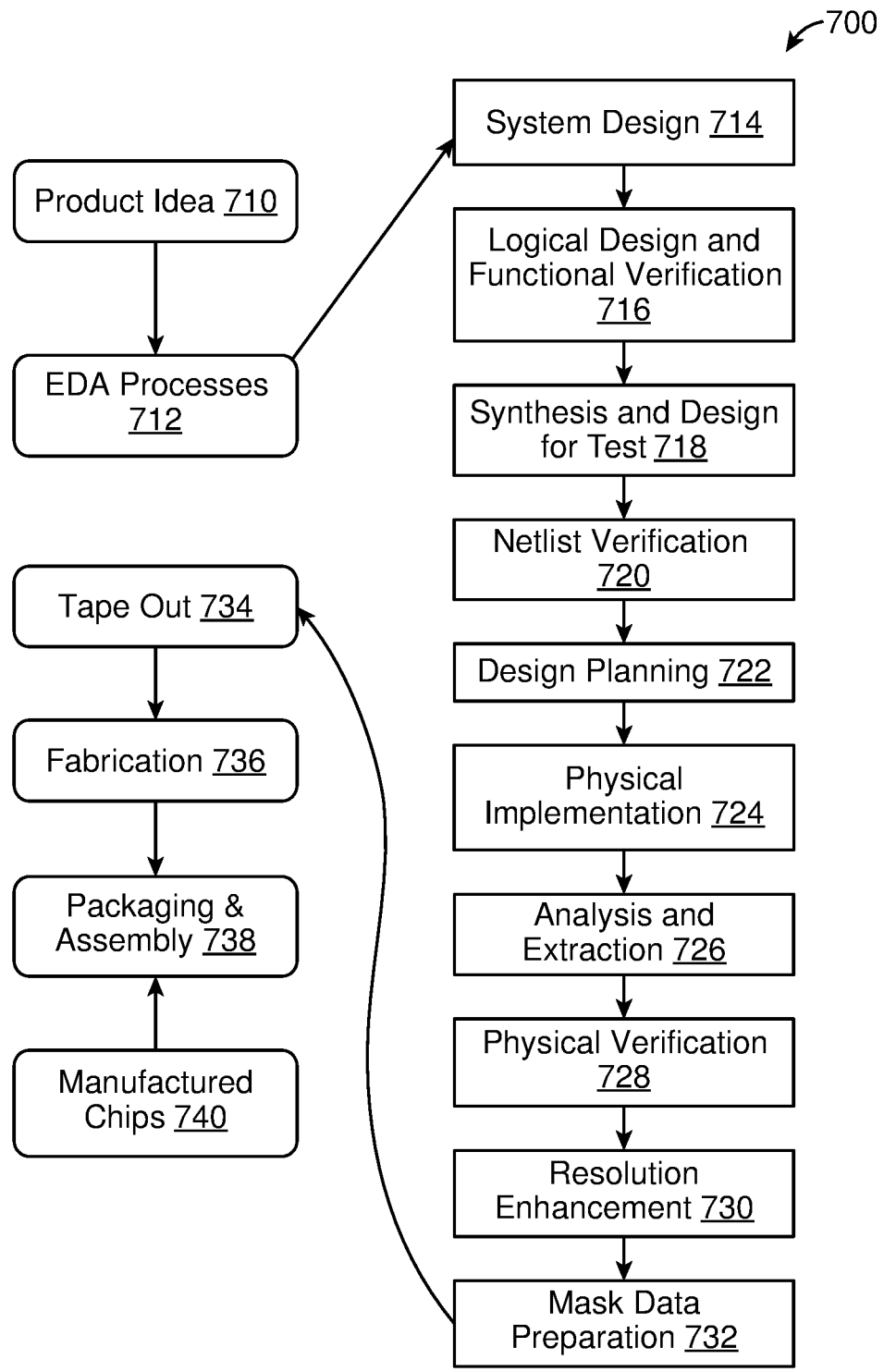
FIG. 7 depicts a flowchart of various processes used during the design and manufacture of an integrated circuit in accordance with some embodiments of the present disclosure.

The process disclosed may be used for to instantiating an integrated circuit chip designed in an electronic design automation process. FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740. By way of example, the process described herein may applied during fabrication 736.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 7. The processes described by be enabled by EDA products (or tools).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
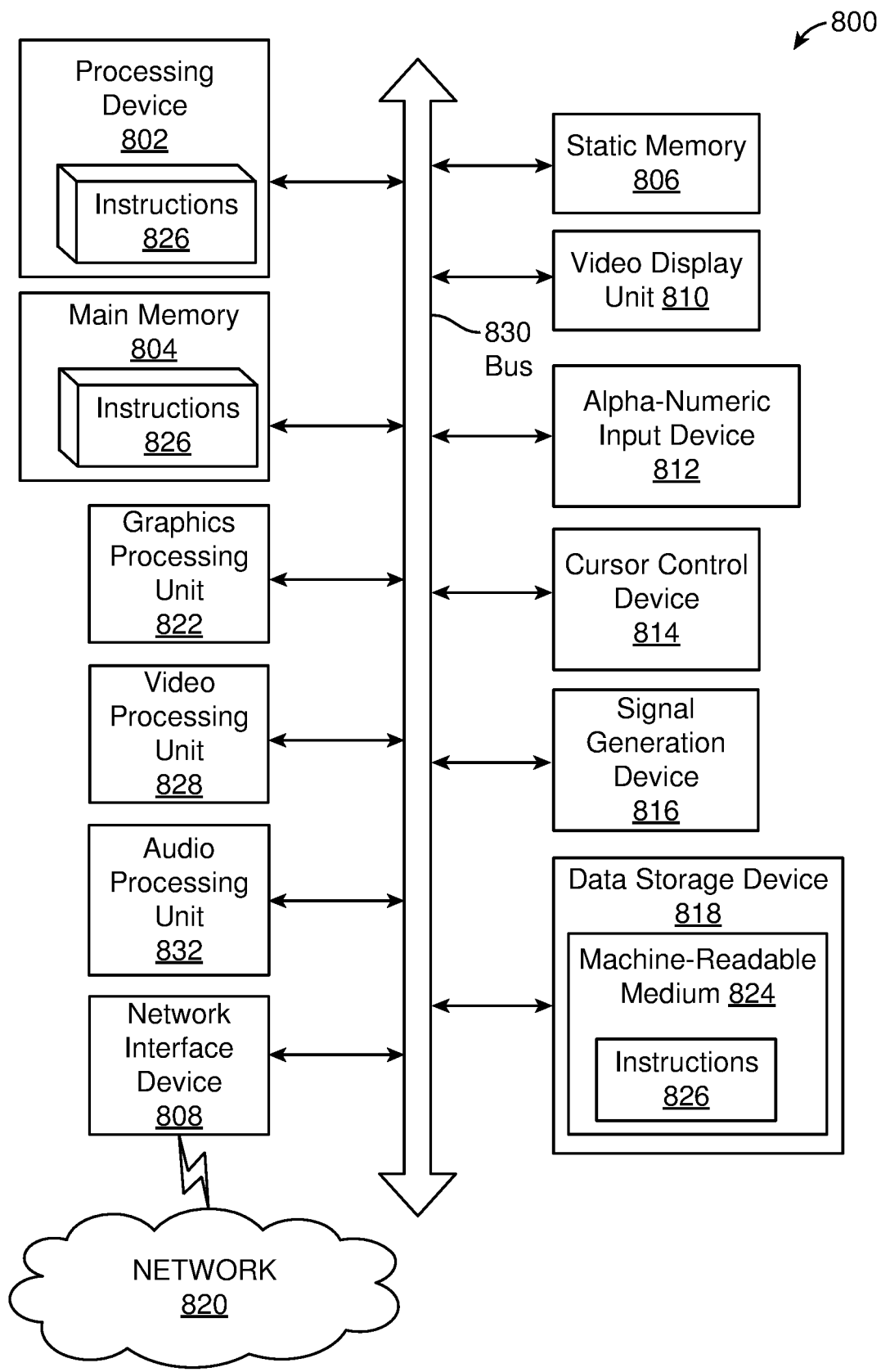
FIG. 8 depicts an abstract diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method for ion implantation or plasma doping to isolate devices within an integrated circuit layout, the method comprising:
   layering a photolithographic mask having one or more openings on a silicon substrate;
   directing a focused ion beam towards the silicon substrate to implant ions in the silicon substrate, the silicon substrate having a fin, the fin having a first side and a second side, the method further comprising:
     transmitting the focused ion beam at a first angle on the first side of the fin to implant a first set of ions in the fin of the substrate, and
     transmitting the focused ion beam at a second angle on second side of the fin to implant a second set of ions in the fin; and
   annealing the silicon substrate to activate a reaction between silicon of the silicon substrate and the implanted ion to achieve formation of a dielectric material in the silicon substrate.

2. The method of claim 1, wherein the focused ion beam is an oxygen ion beam.

3. The method of claim 2, wherein the dielectric material is a silicon dioxide.

4. The method of claim 1, wherein the focused ion beam is a nitrogen ion beam and wherein the dielectric material is a silicon nitride.

5. The method of claim 1, wherein the focused ion beam is at a predefined energy, angle, and dose based on a desired implantation depth for the implanted ions in the silicon substrate.

6. The method of claim 1, wherein the silicon substrate comprises a silicon germanium substrate.

7. A non-transitory computer readable storage medium comprising stored instructions that when executed causes a processing system to:
   layer a photolithographic mask having one or more openings on a silicon substrate;
   direct a focused ion beam towards the silicon substrate to implant ions in the silicon substrate at the one or more openings in the photolithographic mask, the silicon substrate having a fin, the fin having a first side and a second side, the instructions further comprising instructions that causes a processing system to:
     transmit the focused ion beam at a first angle on the first side of the fin to implant a first set of ions in the fin of the substrate, and
     transmit the focused ion beam at a second angle on second side of the fin to implant a second set of ions in the fin; and
   anneal the silicon substrate to activate a reaction between silicon of the silicon substrate and the implanted ion to form a dielectric material in the silicon substrate.

8. The non-transitory computer readable storage medium of claim 7, wherein the instruction to direct the focused ion beam comprises instructions to direct an oxygen ion beam.

9. The non-transitory computer readable storage medium of claim 8, wherein the dielectric material is a silicon dioxide.

10. The non-transitory computer readable storage medium of claim 7, wherein the instruction to direct the focused ion beam comprises instructions to direct a nitrogen ion beam.

11. The non-transitory computer readable storage medium of claim 10, wherein the dielectric material is a silicon nitride.

12. The non-transitory computer readable storage medium of claim 7, wherein the ion beam is at a predefined energy, angle, and dose based on a desired implantation depth for the implanted ions in the silicon substrate.

13. The non-transitory computer readable storage medium of claim 7, wherein the silicon substrate comprises a silicon germanium substrate.

14. A system comprising:
a memory storing instructions; and
a processor, coupled with the memory and to execute the instructions, the instructions when executed cause the processor to:
layer a photolithographic mask having one or more openings on a silicon substrate;
direct a focused ion beam towards the silicon substrate to implant ions in the silicon substrate at the one or more openings in the photolithographic mask, the silicon substrate having a fin, the fin having a first side and a second side, the instructions further comprising instructions that causes a processing system to:
transmit the focused ion beam at a first angle on the first side of the fin to implant a first set of ions in the fin of the substrate, and
transmit the focused ion beam at a second angle on second side of the fin to implant a second set of ions in the fin; and
anneal the silicon substrate to activate a reaction between silicon of the silicon substrate and the implanted ion to form a dielectric material in the silicon substrate.

15. The system of claim 14, wherein the instruction to direct the focused ion beam comprises instructions to direct an oxygen ion beam.

16. The system of claim 15, wherein the dielectric material is a silicon dioxide.

17. The system of claim 14, wherein the instruction to direct the focused ion beam comprises instructions to direct a nitrogen ion beam.

18. The system of claim 17, wherein the dielectric material is a silicon nitride.

19. The system of claim 14, wherein the ion beam is at a predefined energy, angle, and dose based on a desired implantation depth for the implanted ions in the silicon substrate.

20. The system of claim 14, wherein the silicon substrate comprises a silicon germanium substrate.

* * * * *